United States Patent
Kumar et al.

(10) Patent No.: US 6,631,093 B2
(45) Date of Patent: Oct. 7, 2003

(54) LOW POWER PRECHARGE SCHEME FOR MEMORY BIT LINES

(75) Inventors: Sudarshan Kumar, Fremont, CA (US); Jiann-Cherng Lan, San Jose, CA (US); Wenjie Jiang, San Jose, CA (US); Gaurav Mehta, Folsom, CA (US); Sadhana Madhyastha, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,361

(22) Filed: Jun. 29, 2001

(65) Prior Publication Data

US 2003/0002382 A1 Jan. 2, 2003

(51) Int. Cl.$^7$ ................................................. G11C 7/00
(52) U.S. Cl. ....................... 365/203; 365/204
(58) Field of Search .................. 365/203, 190, 365/207, 204

(56) References Cited

U.S. PATENT DOCUMENTS

| | | | | |
|---|---|---|---|---|
| 4,852,064 A | * | 7/1989 | Kim et al. ............. | 365/189.07 |
| 5,349,560 A | * | 9/1994 | Suh et al. .................... | 365/190 |
| 5,781,469 A | * | 7/1998 | Pathak et al. ............... | 365/156 |
| 6,130,846 A | * | 10/2000 | Hori et al. ................... | 365/203 |
| 6,205,068 B1 | * | 3/2001 | Yoon .......................... | 365/203 |
| 6,333,881 B1 | * | 12/2001 | Kusunoki et al. ........... | 365/154 |
| 6,351,422 B2 | * | 2/2002 | Rohr et al. ............ | 365/189.01 |
| 6,366,512 B1 | * | 4/2002 | Yeh et al. .................... | 365/203 |

* cited by examiner

*Primary Examiner*—VanThu Nguyen
(74) *Attorney, Agent, or Firm*—Cynthia T. Faatz

(57) ABSTRACT

A low power memory bit line precharge scheme. A memory bit line is coupled to a first read precharge device. A second write precharge device is also coupled to the memory bit line and is to be enabled only in response to a memory write operation. The first read and second write precharge devices are sized such that their combined drive strength is sufficient to precharge the first memory bit line during a precharge period following a write operation.

24 Claims, 3 Drawing Sheets

LOW POWER PRECHARGE SCHEME FOR MEMORY BIT LINES

BACKGROUND

1. Field

An embodiment of the present invention relates to the field of memories, and, more particularly, to a low power memory bit line precharge scheme.

2. Discussion of Related Art

The increasing power consumption of microprocessors and other integrated circuits (ICs) has become one of the major issues for current and next generation designs. Power-related costs (e.g. cooling and power delivery) can have a significant impact on the overall cost of an integrated circuit chip and, therefore, cut into profit margins in an increasingly competitive marketplace. Additionally, high power consumption and junction temperatures can limit the performance of high-end microprocessors and other ICs.

More particularly, register files and other memory can consume a significant percentage of power on a microprocessor, for example. For current and next generation microprocessors, the size and number of memory structures on a microprocessor continues to increase such that the percentage of overall power dissipation attributable to these structures is also expected to rise.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for low power memory bit line precharging is described. In the following description, particular types of integrated circuits and circuit configurations are described for purposes of illustration. It will be appreciated, however, that other embodiments are applicable to other types of integrated circuits, and to circuits configured in another manner.

For one embodiment, a memory bit line coupled to a memory is coupled to a first read precharge device. A second write precharge device is also coupled to the memory bit line and is enabled only in response to a memory write operation. Further details of this and other embodiments are provided in the description that follows.

For purposes of example, embodiments of the invention are described below in reference to an exemplary memory on a microprocessor. It will be appreciated, however, that other embodiments may be applicable to a different type of memory that is organized in a different manner and/or to a memory provided on a different type of processor or other type of integrated circuit chip.

Figure 1:
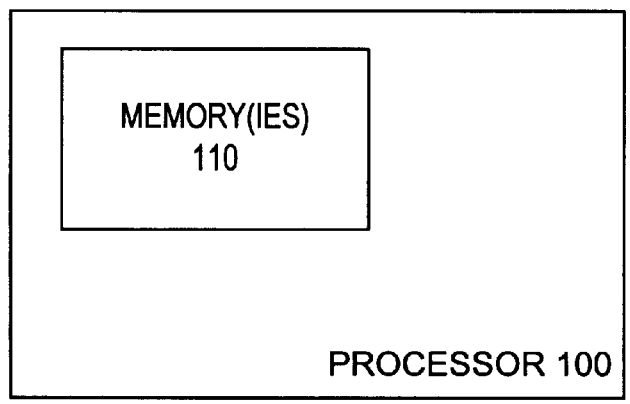
FIG. 1 is a block diagram of a processor in which the low power bit line precharge scheme of one embodiment may be advantageously used.

FIG. 1 is a block diagram of a processor 100 in which the memory bit line precharging approach of one embodiment (shown in FIG. 3 below) may be advantageously used. The processor 100 may include, for example, one or more memories 110 such as one or more cache memory(ies), one or more register file(s), etc.

It will be appreciated that the processor 100 includes other functional blocks and/or other types of circuitry that are not shown in FIG. 1.

Figure 2:
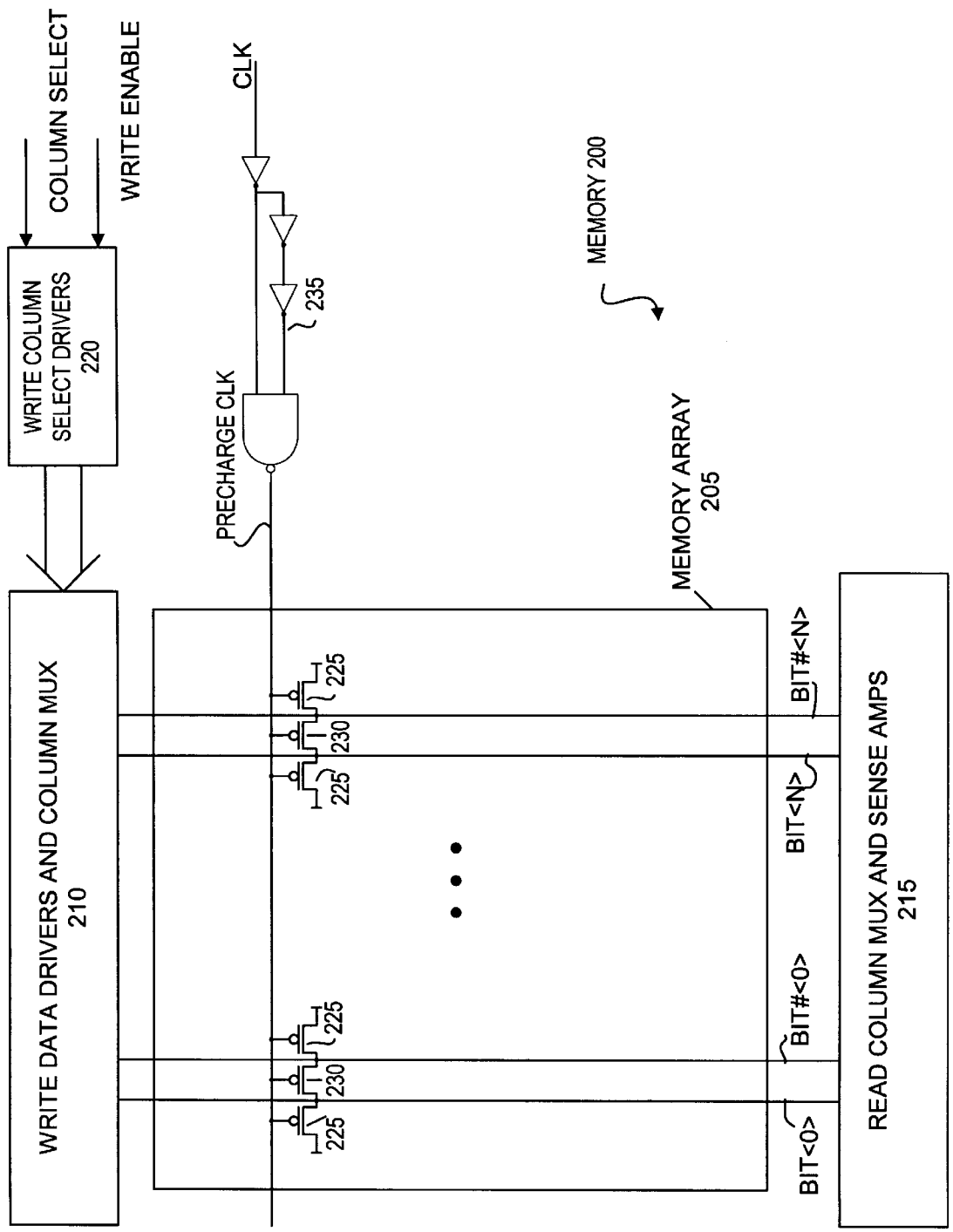
FIG. 2 is a schematic and block diagram showing the structure of a prior memory.

FIG. 2 is a schematic and block diagram of a prior memory 200 that may currently be used to provide one or more of the memories 110 of FIG. 1. The memory 200 includes a memory array 205, write data drivers and column multiplexer (mux) circuitry 210, read column mux and sense amplifier (sense amp) circuitry 215 and write column select drivers 220. The memory 200 also includes true and complementary (differential) bit lines BIT<0> . . . BIT<N> and BIT#<0> . . . BIT#<N>, respectively, coupled to memory elements (not shown) in the memory array 205, precharge devices 225 coupled to precharge the bit lines, equalization devices 230 to equalize the differential bit lines during a precharge operation and clock delay circuitry 235 to provide a precharge clock signal.

Although only two sets of complementary bit lines are shown, the memory 200 may include any number of pairs of bit lines. Further, it will be appreciated that the memory 200 may include other circuitry not shown in FIG. 2.

In operation, where a memory write operation is directed to one or more memory cells in the memory array 205, write enable and column select signals are received at the write column select drivers 220. In response, the write column select drivers 220 control the write data drivers and column multiplexer circuitry 210 to drive the bit lines corresponding to the memory cell(s) to be written according to the data to be written.

If, for example, a logical one value is to be written to a memory cell located in a column of the memory array that is coupled to the bit lines BIT<0> and BIT#<0>, the write data drivers and column mux circuitry 210 cause the bit line BIT<0> to be pulled high and the bit line BIT#<0> to be pulled low for one exemplary memory. Word line (row) select circuitry (not shown) is also included to select the desired memory cell in the column to be written.

Typically, for a memory write operation, the complementary bit lines for the selected column are pulled rail-to-rail (or close to rail-to-rail) to ensure that the desired data is written to the memory cell. In other words, if BIT#<0> is to be pulled low as in the above example, it is pulled to ground while BIT<0> is held at the supply voltage of the memory 200.

Where a memory read operation is instead directed to the memory array 205, select signals (not shown) are received by the read column mux and sense amp circuitry 215 to cause the bit lines coupled to a memory cell to be read to be discharged according to the value stored in the memory cell. The corresponding sense amp(s) then sense the bit lines to determine the value stored in the memory cell.

In contrast to a memory write operation, for a memory read operation, the value stored in a memory cell can be detected by the sense amps 215 after only partially discharging the appropriate bit line(s). For example, for one memory, the value stored in a memory cell may be determined after discharging one of the bit lines by only 200–300 mV.

Following a memory access operation of any type, in preparation for the next memory access operation, the bit lines BIT<0> . . . BIT<N> and BIT#<0> . . . BIT#<N> are precharged and complementary pairs of bit lines are equalized. Precharge and equalization of the bit lines is performed by the precharge 225 and equalization devices 230, respectively, in response to a precharge clock signal (precharge clk) from delay circuitry 235 transitioning low. For this example, the bit lines are precharged high, but for another example, the bit lines may alternatively be precharged low.

Because a memory write operation may cause a bit line to be pulled all the way to ground, the precharge and equalization devices must be sized to be large enough to ensure that the bit lines can be pulled from ground to the supply voltage level during the time that the precharge clk signal is low (referred to herein as the precharge period). For high frequency operation, the precharge clock signal may be low for a very short amount of time such that the precharge devices must be relatively large to provide the desired pull-up strength.

This worst case sizing for precharging following a write operation is used even though, for many memory implementations, read operations, which cause the bit lines to be only partially discharged, are more frequent than write operations.

Figure 3:
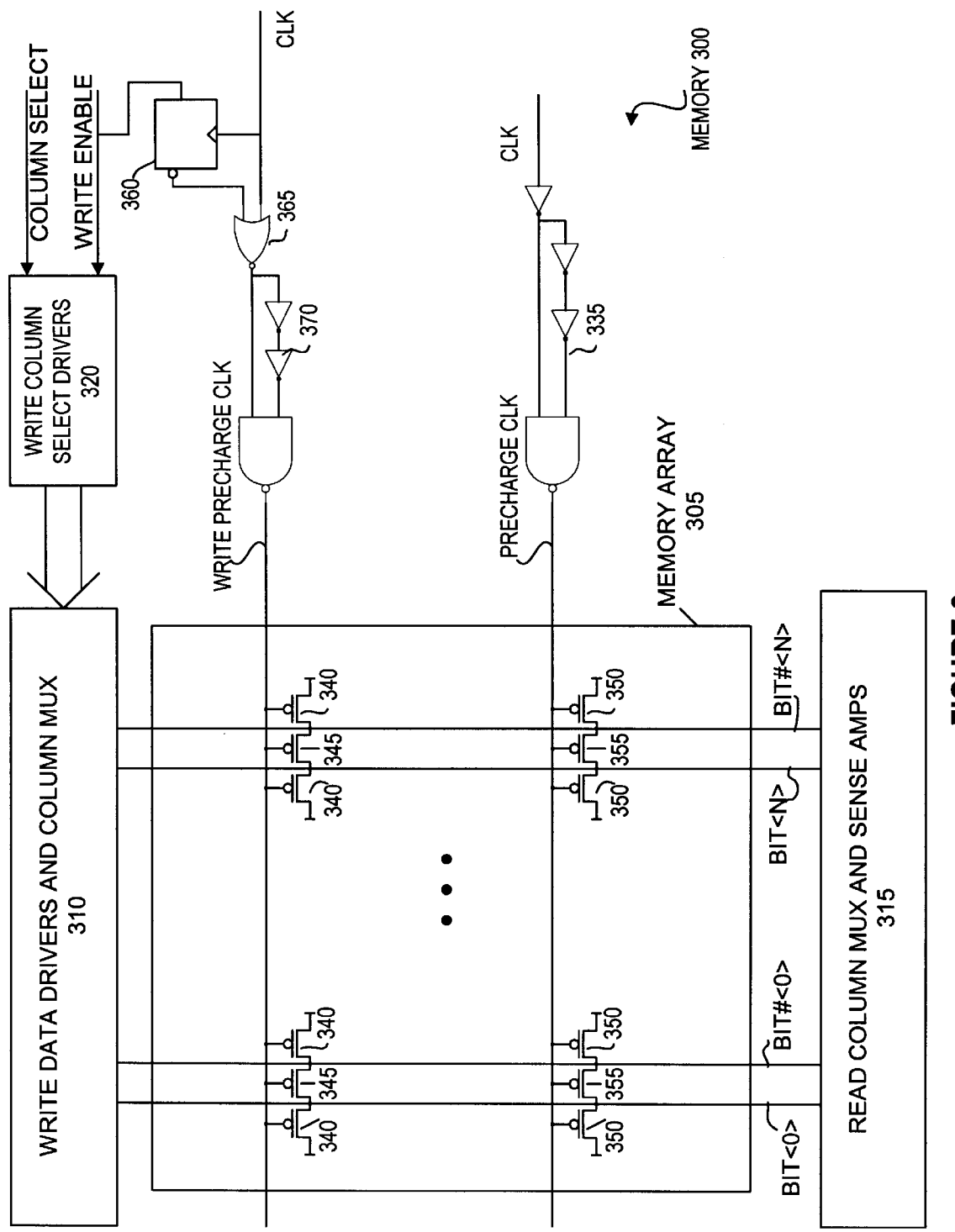
FIG. 3 is a schematic and block diagram of a memory in which the low power bit line precharge scheme of one embodiment is implemented.

To address this issue, FIG. 3 shows a block and schematic diagram of a memory 300 of one embodiment that may be used to provide one or more of the memories 110 of FIG. 1 or a memory on a different type of integrated circuit device. Like the memory 200, the memory 300 includes a memory array 305, write data drivers and column mux circuitry 310, read column mux and sense amp circuitry 315, write column select drivers 320 and a delay circuit 335 to provide a precharge clock signal. Unlike the memory 200, however, the memory 300 includes separate write precharge 340 and equalization devices 345 and read precharge 350 and equalization devices 355.

In operation, for a memory write operation directed to the memory array 305, column select and write enable signals are received at the write column select drivers 320. In response, the write column select drivers 320 control the write data drivers and column multiplexer circuitry 310 to drive the bit lines corresponding to the memory cell(s) to be written according to the data to be written as described above in reference to FIG. 2. Writing of the selected memory cell(s) occurs in response to the clock signal CLK going high for this exemplary embodiment.

Concurrently with the arrival of the write enable signal at the write column select drivers 320, the write enable signal is received by a latch 360. When the clock signal CLK transitions high, the write enable signal is latched.

Precharging and equalization of the bit lines following a write operation is performed in a different manner than for the memory 200 of FIG. 2. After the clock signal CLK transitions low at an input to read clock delay circuitry 335, four inversions later, the precharge CLK signal transitions low to enable read precharge and equalization devices 350 and 355, respectively.

Concurrently, in response to the clock signal CLK transitioning low, an output of a NOR gate 365 transitions high (due to the high value of the write enable signal latched by the latch 360). In this manner, four inversions after the clock signal CLK transitions low, a write precharge clock signal at an output of write clock delay circuitry 370 also transitions low. The low value of the write precharge clock signal causes write precharge and equalization devices 340 and 345, respectively, to be enabled.

Thus, following a write operation directed to the memory array 305, the read and write precharge devices 340 and 350 and the read and write equalization devices 345 and 355 are all enabled to precharge and equalize the bit lines BIT<0> . . . BIT<N> and BIT#<0> . . . BIT#<N>. For one embodiment, as discussed above, for a write operation, bit lines may be pulled rail-to-rail. Therefore, the combined strength of the read and write precharge devices should be such that any bit lines that have been fully discharged can be fully precharged during the time that the precharge clock and write precharge clock signals are low (i.e. during the precharge period). The write equalization devices 345 may be sized, for one embodiment, to have a width substantially similar to the width of the write precharge devices.

Where a memory access operation directed to the memory array 305 is instead a read operation, the write enable signal is not asserted (i.e. for this example, it is low). A transition of the clock signal CLK from low to high causes data from the desired memory cell to be read by allowing corresponding bit line(s) to be discharged. As described above, using the sense amps 315, it is possible to read the value stored in a memory cell of the memory array 305 after only a small differential has been developed on the corresponding bit lines. This differential voltage for one embodiment may be in the range of 200–300 mV, for example. Therefore, the precharge devices 350 activated following a memory read access only need to be capable of pulling the bit lines up by a relatively small amount.

For the post-read precharge operation, in response to the clock signal CLK transitioning low, the precharge clock signal at an output of the clock delay circuitry 335 transitions low four inversions later to initiate the precharge period. For some embodiments, a read enable signal (not shown) may be used to gate the precharge clock signal such that it is only provided to the read precharge and equalization devices 350 and 355 in response to a read operation and not every clock cycle. The low value of the precharge clock signal causes the read precharge and equalization devices 350 and 355 to be enabled to precharge and equalize the bit lines BIT<0> . . . BIT<N> and BIT#<0> . . . BIT#<N>.

The write precharge and equalization devices 340 and 345, however, are not enabled. For a memory read operation, the write enable signal is low. This low value is latched by the latch 360 in response to the clock signal CLK transitioning high. Therefore, when the clock signal CLK transitions low to initiate the precharge operation, the write precharge clock signal remains high.

The precharge period ends in this example, two inversions after the clock signal CLK transitions high.

In the above-described manner, following a read operation during which one or more of the bit lines is only partially discharged, read precharge and equalization devices 350 and 355 alone can be used to precharge and equalize the bit lines BIT<0> . . . BIT<N> and BIT#<0> . . . BIT#<N>. Further, the read precharge devices 350 may be sized to provide only the drive (i.e. pull-up, in this example) strength needed to precharge the bit lines during the precharge period from a partially discharged state resulting from a read access. As mentioned above, for some exemplary memories, bit lines may only transition 200–300 mV from their precharged level during a memory read operation. Thus, the read precharge devices 350 may be relatively small. For one embodiment, the read equalization devices 355 are sized to have a width that is substantially similar to the width of the read precharge devices.

For purposes of illustration, it is assumed, for example, that, in order to provide for worst case precharging and equalization of the bit lines BIT<0> . . . BIT<N> for the memory 200 of FIG. 2, i.e. for precharging and equalization following a memory write operation, the precharge and equalization devices 225 and 230 are each sized to be 10 microns wide. Thus, per bit of the memory array 205, there is 30 microns of switched load on the precharge clock during precharge and equalization following either a read or write operation.

In contrast, for the memory of one embodiment as shown in FIG. 3, as described above, the read precharge and equalization devices 350 and 355 can be significantly smaller than the precharge and equalization devices 225 and 230 of the memory 200. This is because a worst case bit line transition during a memory read operation may be much smaller than a worst case bit line transition during a memory write operation. For the example provided above where the worst case voltage swing during a read operation is about 300 mV, where the precharge and equalization devices 225 and 230 of the memory 200 are 10 microns wide, the read precharge and equalization devices 350 and 355 may only need to be 3 microns wide, for example.

Thus, following a memory read operation, per bit, there is only 9 microns of switched load on the precharge clock during a precharge operation.

For a precharge operaton following a memory write operation, it is the combination of the read precharge and equalization devices 350 and 355 with the write precharge and equalization devices 340 and 345 that provides the necessary pull-up strength for a worst case bit line transition. For the above example, where the read precharge and equalization devices are 3 microns wide, assuming the pull-up strength needed is the same as for the memory 200 and other variables such as process, supply voltage, etc. are equivalent, the write precharge and equalization devices may be sized to be only 7 microns ($\mu$m) wide.

By using smaller read precharge and equalization devices, significant power savings for precharge operations following a memory read access may be realized with little area impact. For the above example, for instance, assuming 80% of memory accesses are read operations and 20% are write operations, a 56% reduction in precharge clock power may be realized. This is determined by calculating the switched load (width of the transistor for this example) per bit for the memory 200 of FIG. 2 and comparing it with the switched load per bit for the memory 300 of FIG. 3. The switched load per bit for the memory 200 of FIG. 2 for the example given is:

$$10 \; \mu\text{m/transistor} * 3 \; \text{transistors/bit} = 30 \; \mu\text{m/bit of switched load on the precharge clock} \quad (1)$$

The switched load per bit for the memory 300 of FIG. 3 for the given example is:

$$3 \; \mu\text{m/transistor} * 3 \; \text{transistors/bit} = 9 \; \mu\text{m/bit (for read)} \quad (2)$$

$$(3+7) \; \mu\text{m/transistor} * 3 \; \text{transistors/bit} = 30 \; \mu\text{m/bit (for write)} \quad (3)$$

Thus, the reduction in precharge clock power for a given exemplary ratio of read to write operations of 80%/20% is:

$$(9 \; \mu\text{m/bit/read} * 80\% \; \text{reads}) + (30 \; \mu\text{m/bit/write} * 20\% \; \text{writes}) = 13.2 \; \mu\text{m/bit} \quad (4)$$

$$(30 \; \mu\text{m/bit} - 13.2 \; \mu\text{m/bit})/30 \; \mu\text{m/bit} = 56\% \; \text{reduction in precharge clock power} \quad (5)$$

In the above equations, for equation (3), it will be appreciated that the "transistor" term refers to the combination of read and write precharge and equalization transistors used to precharge and equalize a particular pair of bit lines. Further, for equation (5), the reduction in precharge clock power is the overall reduction in precharge clock power seen by the combination of the precharge clock circuitry 335 and the write precharge clock circuitry 370.

The above example is provided for illustrative purposes only. For other embodiments, different transistor sizes and relative transistor sizes may be used. Further, it will be appreciated that the power savings for other embodiments as compared to a memory for which the same precharge and equalization devices are used for both read and write operations may also differ. This difference may be based on, for example, different relative transistor sizes and/or a different ratio of read to write operations.

For the embodiment of FIG. 3, due to the reduced precharge clock load, it may also be possible to reduce the sizes of the devices comprising the clock delay circuitry 335 and 370 as compared to the clock delay circuitry 235 for the memory 200. For instance, the devices of the clock delay circuitry 235 for the example provided above are sized to drive a 30 $\mu$m/bit load during precharge and equalization. For the memory 300 of FIG. 3, however, for the exemplary device sizes discussed above, the clock delay circuitry 335 may be sized to drive a 9 $\mu$m/bit load while the clock delay circuitry 370 may be sized to drive a 21 $\mu$m/bit load.

Using the above-described approach, the precharge circuit clock load may be significantly reduced for some embodiments. The reduction in precharge clock load results in a reduction in total memory power dissipation. Further, this may be accomplished without a significant increase in memory area.

Figure 4:
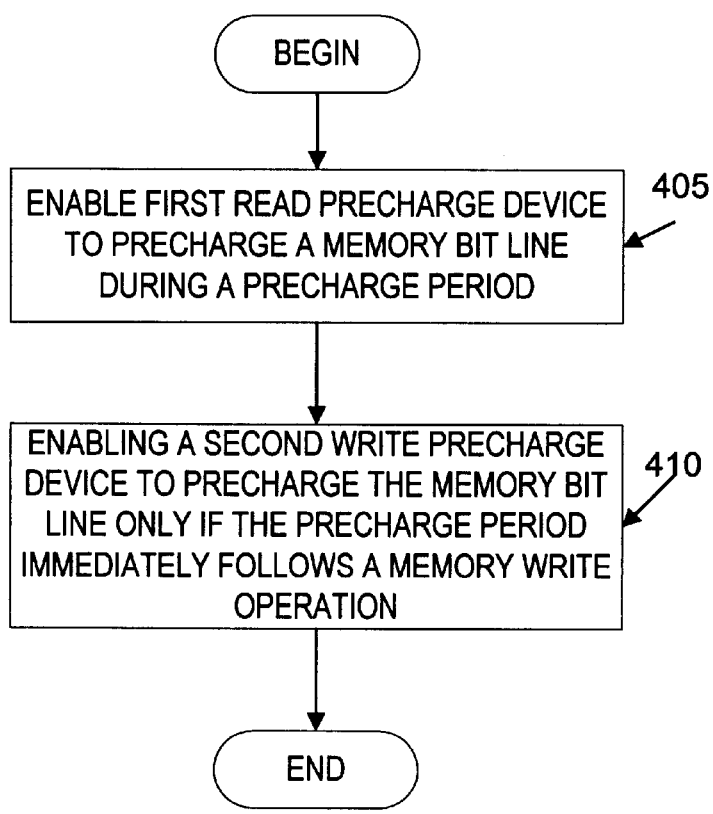
FIG. 4 is a flow diagram showing a method for controlling memory bit line precharging for a memory access operation in accordance with one embodiment.

FIG. 4 is a flow diagram showing the method of one embodiment for low power bit line precharging. At block 405, a first read precharge device is enabled to precharge a memory bit line during a precharge period. At block 410, a second write precharge device is enabled to precharge the memory bit line in conjunction with the first read precharge device only if the precharge period immediately follows a memory write operation.

It will be appreciated that, for some embodiments, the actions of blocks 405 and 410 may occur concurrently. Further, it will be appreciated that the method of other embodiments may include additional actions not shown or described in conjunction with FIG. 4.

Thus, a low power memory bit line precharge approach is described. In the foregoing specification, the invention has been described with reference to specific exemplary embodiments thereof. It will, however, be appreciated that various modifications and changes may be made thereto without departing from the broader spirit and scope of the invention as set forth in the appended claims. For example, for some memories, the bit lines may be precharged low instead of being precharged high. For such embodiments, appropriate complementary logic is also provided. The specification and drawings are, accordingly, to be regarded in an illustrative rather than a restrictive sense.

What is claimed is:

1. An apparatus comprising:
   a first memory bit line coupled to a memory;
   a first read precharge device coupled to the first memory bit line, and
   a first write precharge device coupled to the first memory bit line, the first write precharge device to be enabled only in response to a memory write operation, wherein the first read and first write precharge devices are sized such that their combined drive strength is sufficient to precharge the first memory bit line during a precharge period following the memory write operation.

2. The apparatus of claim 1 further comprising
a plurality of differential memory bit line pairs including the first memory bit line;
a plurality of read precharge devices including the first read precharge device, at least one read precharge device of the plurality of read precharge devices being coupled to each memory bit line;
a plurality of write precharge devices including the second write precharge device, at least one read precharge device of the plurality of read precharge devices being coupled to each memory bit line;
a plurality of read equalization devices, at least one read equalization device of the plurality of read equalization devices being coupled to each differential memory bit line pair between two read precharge devices; and
a plurality of write equalization devices, at least one write equalization device of the plurality of write equalization devices being coupled to each differential memory bit line pair between two write precharge devices.

3. The apparatus of claim 1 wherein the first read and second write precharge devices are sized such that their combined drive strength is sufficient to precharge the first memory bit line during a precharge period following a write operation.

4. The apparatus of claim 1 wherein the first read precharge device is sized such that the drive strength of the first read precharge device is sufficient to precharge the first memory bit line during a precharge period following a read operation.

5. The apparatus of claim 4 further comprising:
a read equalization device coupled to the first read precharge device, the read equalization device being substantially a same width as the first read precharge device; and
a write equalization device coupled to the first write precharge device, the write equalization device being substantially a same width as the first write precharge device.

6. The apparatus of claim 1 wherein
the first write precharge device is enabled in response to a write enable signal.

7. An apparatus comprising:
a differential bit line pair coupled to a memory, the differential bit line pair comprising first and second bit lines;
first and second read precharge devices coupled to the first and second bit lines, respectively;
first and second write precharge devices coupled to the first and second bit lines, respectively, the first and second write precharge devices to be enabled only in response to a write operation directed to the memory;
a read equalization device coupled between the first and second bit lines; and
a write equalization device coupled between the first and second bit lines, the write equalization device to be enabled to equalize the first and second bit lines only during a precharge operation following the write operation directed to the memory.

8. The apparatus of claim 7 further comprising:
a read equalization device coupled between the first and second bit lines; and
a write equalization device coupled between the first and second bit lines, the write equalization device to be enabled to equalize the first and second bit lines only during a precharge operation following a write operation directed to the memory.

9. The apparatus of claim 7 wherein
the read equalization device and the first and second read precharge devices are sized to have widths to substantially similar each other, and
the write equalization device and the first and second write precharge devices are sized to have widths substantially similar to each other.

10. The apparatus of claim 7 wherein the first read precharge device and the first write precharge device are sized such that the combined drive strength of the first read precharge device and the first write precharge device is sufficient to transition the first bit line from rail-to-rail during a precharge period during which the first bit line is precharged.

11. The apparatus of claim 10 wherein the first read precharge device is sized such that the drive strength of the first read precharge device is sufficient to precharge the first bit line during a precharge period following a read operation directed to the memory.

12. An apparatus comprising:
a first memory bit line coupled to a memory;
a read precharge device coupled to the first memory bit line, the first read precharge device being sized to precharge the first memory bit line following a transition of the first memory bit line in response to a read operation; and
a larger write precharge device coupled to the first memory bit line, the larger write precharge device being sized to precharge the first memory bit line in cooperation with the first read precharge device following a transition of the first memory bit line in response to a write operation.

13. The apparatus of claim 12 wherein
the first memory bit line is one bit line in a pair of complementary bit lines including a second memory bit line, the apparatus of claim 12 further including
a read equalization device coupled between the first and second memory bit lines and coupled to the read precharge device, and
a write equalization device coupled between the first and second memory bit lines and coupled to the larger write precharge device.

14. The apparatus of claim 13 wherein
a width of the read equalization device is substantially similar to a width of the read precharge device, and
a width of the write equalization device is substantially similar to a width of the larger write precharge device.

15. The apparatus of claim 13 wherein the larger write precharge and equalization devices are enabled in response to a write enable signal.

16. A memory comprising:
a memory array including a plurality of memory elements;
a plurality of differential bit line pairs coupled to the memory array;
a read precharge device coupled to each bit line in each differential bit line pair; and
a write precharge coupled to each bit line in each differential bit line pair, the write precharge devices being enabled only in response to a memory write operation,
wherein the read precharge devices are sized such that the drive strength of each read precharge device is sufficient to precharge the corresponding bit line following a transition of the bit line in response to the memory read operation directed to the memory array, and the write precharge devices are sized such that for each bit line, the combined drive strength of the respective write precharge device and read precharge device is sufficient to precharge the bit line following a transition of the bit line in response to the memory write operation directed to the memory array.

17. The memory of claim 16 further comprising:

a read equalization device coupled between the bit lines of each differential bit line pair, the read equalization devices to be enabled concurrently with the read precharge devices, and a write equalization device coupled between the bit lines of each differential bit line pair, the write equalization devices to be enabled concurrently with the write precharge devices.

18. The memory of claim 16 wherein the read precharge devices are sized such that the drive strength of each read precharge device is sufficient to precharge the corresponding bit line following a transition of the bit line in response to the memory read operation directed to the memory array, and the write precharge devices are sized such that for each bit line, the combined drive strength of the respective write precharge device and read precharge device is sufficient to precharge the bit line following a transition of the bit line in response to a memory write operation directed to the memory array.

19. A method comprising:

enabling a read precharge device to precharge a memory bit line during all precharge periods; and enabling a write precharge device to precharge the memory bit line only during precharge periods immediately following a memory write operation.

20. The method of claim 19 further comprising:

enabling a read equalization device concurrently with enabling the read precharge device, and enabling a write equalization device concurrently with enabling the write precharge device.

21. The method of claim 20 wherein enabling the write precharge and write equalization devices comprises enabling the write precharge and write equalization devices in response to a write enable signal.

22. A method comprising:

providing a memory bit line;

providing a read precharge device to precharge the memory bit line during all precharge periods; and providing a write precharge device to be enabled to precharge the memory bit line only during precharge periods immediately following a memory write operation.

23. The method of claim 22 further comprising:

providing a read equalization device to be enabled concurrently with the read precharge device, and providing a write equalization device to be enabled concurrently with the write precharge device.

24. The method of claim 23 further comprising:

providing a latch to latch a write enable signal, a value of the write enable signal to determine whether the write equalization device is enabled.

* * * * *

UNITED STATES PATENT AND TRADEMARK OFFICE
CERTIFICATE OF CORRECTION

PATENT NO. : 6,631,093 B2
DATED : October 7, 2003
INVENTOR(S) : Kumar et al.

It is certified that error appears in the above-identified patent and that said Letters Patent is hereby corrected as shown below:

<u>Column 7,</u>
Lines 9 and 10, delete "second", insert -- first --.

<u>Column 8,</u>
Line 33, after "cooperation with the", delete "first".

Signed and Sealed this

Seventeenth Day of February, 2004

JON W. DUDAS
*Acting Director of the United States Patent and Trademark Office*